United States Patent
Dong et al.

(10) Patent No.: US 11,987,041 B2
(45) Date of Patent: May 21, 2024

(54) DISPLAY MODULE AND DISPLAY DEVICE

(71) Applicant: BOE TECHNOLOGY GROUP CO., LTD., Beijing (CN)

(72) Inventors: Liming Dong, Beijing (CN); Shiming Shi, Beijing (CN); Lu Liu, Beijing (CN); Lijuan Zhao, Beijing (CN); Zhao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 246 days.

(21) Appl. No.: 17/299,012

(22) PCT Filed: Aug. 26, 2020

(86) PCT No.: PCT/CN2020/111472
§ 371 (c)(1),
(2) Date: Jun. 2, 2021

(87) PCT Pub. No.: WO2022/040990
PCT Pub. Date: Mar. 3, 2022

(65) Prior Publication Data
US 2022/0314579 A1 Oct. 6, 2022

(51) Int. Cl.
*B32B 7/12* (2006.01)
*B32B 1/00* (2006.01)
(Continued)

(52) U.S. Cl.
CPC ............. *B32B 7/12* (2013.01); *B32B 1/00* (2013.01); *H05K 5/0017* (2013.01); *H05K 5/03* (2013.01);
(Continued)

(58) Field of Classification Search
CPC ......... B32B 7/12; B32B 1/00; B32B 2307/42; B32B 2307/546; B32B 2307/732; B32B 2457/20; H05K 5/0017; H05K 5/03
See application file for complete search history.

(56) References Cited

U.S. PATENT DOCUMENTS

2018/0095502 A1* 4/2018 Yamazaki ............. G06F 1/1681
2019/0207141 A1* 7/2019 Kim ..................... H10K 77/111
(Continued)

FOREIGN PATENT DOCUMENTS

CN 107077247 A 8/2017
CN 109564985 A 4/2019
(Continued)

OTHER PUBLICATIONS

MarketsandMarkets, "Flexible Display Market", Mar. 2019 https://web.archive.org/web/20190311153140/https://www.marketsandmarkets.com/Market-Reports/flexible-display-market-788.html (Year: 2019).*

*Primary Examiner* — Michael Zhang
(74) *Attorney, Agent, or Firm* — HOUTTEMAN LAW LLC

(57) ABSTRACT

Embodiments of the present disclosure provide a display module, including: a flexible panel, a first group of film layers attached to a light-emitting side of the flexible panel, and a second group of film layers attached to a non-light-emitting side of the flexible panel away from the light-emitting side. The display module is capable of being folded to a curved plate, such that at least a portion of an orthographic projection of the display module on a first plane perpendicular to the curved plate has a shape of a water-drop profile comprising a neck portion and a body portion. At least a portion of orthographic projections, on the first plane, of two opposite ends of the display module forms the neck portion, and an orthographic projection, on the first plane, of (Continued)

a middle portion of the display module between the two opposite ends forms the body portion.

18 Claims, 3 Drawing Sheets

(51) Int. Cl.
*H05K 5/00* (2006.01)
*H05K 5/03* (2006.01)

(52) U.S. Cl.
CPC ..... *B32B 2307/42* (2013.01); *B32B 2307/546* (2013.01); *B32B 2307/732* (2013.01); *B32B 2457/20* (2013.01)

(56) References Cited

U.S. PATENT DOCUMENTS

| | | | |
|---|---|---|---|
| 2020/0266368 | A1 | 8/2020 | Park et al. |
| 2022/0005385 | A1* | 1/2022 | Feng ................. G09F 9/301 |
| 2022/0191312 | A1* | 6/2022 | Yan .................. H04M 1/0214 |

FOREIGN PATENT DOCUMENTS

| | | |
|---|---|---|
| CN | 110853510 A | 2/2020 |
| CN | 110992838 A | 4/2020 |
| CN | 111105715 A | 5/2020 |
| CN | 111312080 A | 6/2020 |
| CN | 111489644 A | 8/2020 |
| CN | 111583788 A | 8/2020 |
| JP | 2020109177 A | 7/2020 |
| KR | 20190060463 A | 6/2019 |

* cited by examiner

DISPLAY MODULE AND DISPLAY DEVICE

TECHNICAL FIELD

The present disclosure relates to the field of display technologies, and in particular, to a display module and a display device.

BACKGROUND

With the vigorous development of science and technology, foldable flexible modules have come into the visual field of ordinary consumers. The foldable flexible modules include two kinds of flexible modules, i.e., a flexible module capable of being folded outward and a flexible module capable of being folded inward. The flexible module capable of being folded outward refers to a flexible module whose display side faces outward when the flexible module is in folded state. The flexible module capable of being folded outward can provide more convenient service for a user, and the display side facing outward requires high requirements on scratch resistance and impact resistance of the flexible module. The flexible module capable of being folded inward refers to a flexible module whose display side faces inward when the flexible module is in folded state. Since the flexible module capable of being folded inward can avoid defects such as scratch on the flexible module, the flexible module capable of being folded inward has become an important development trend of the foldable flexible module.

SUMMARY

Embodiments of the present disclosure provide a display module and a display device.

As a first aspect, an embodiment of the present disclosure provides a display module. The display module includes: a flexible panel, a first group of film layers attached to a light-emitting side of the flexible panel via a first group of adhesive layers, and a second group of film layers attached, via a second group of adhesive layers, to a non-light-emitting side of the flexible panel away from the light-emitting side.

The display module is capable of being folded to a curved plate, such that at least a portion of an orthographic projection of the display module on a first plane perpendicular to the curved plate has a shape of a water-drop profile. The water-drop profile includes a neck portion and a body portion. At least a portion of orthographic projections, on the first plane, of two opposite ends of the display module forms the neck portion, and an orthographic projection, on the first plane, of a middle portion of the display module between the two opposite ends forms the body portion.

The neck portion is an arc line and a curvature radius at any point on the arc line of the neck portion is in a range from 16 mm to 20 mm, and the body portion is an arc line and a curvature radius at any point on the arc line of the body portion is in a range of 4±0.5 mm.

In some embodiments, the first group of film layers includes a polarizer and a cover plate, the first group of adhesive layers includes a first sub-adhesive layer and a second sub-adhesive layer, and the first sub-adhesive layer, the polarizer, the second sub-adhesive layer and the cover plate are sequentially stacked on the light-emitting side of the flexible panel.

The second group of film layers includes a bottom film and a support film, the second group of adhesive layers includes a third sub-adhesive layer and a fourth sub-adhesive layer, and the third sub-adhesive layer, the bottom film, the fourth sub-adhesive layer, and the support film are sequentially stacked on the non-light-emitting side of the flexible panel.

In some embodiments, both of the second sub-adhesive layer and the fourth sub-adhesive layer are flexible layers and made of a same material. Each of the second sub-adhesive layer and the fourth sub-adhesive layer has a modulus in a range of 55 KPa±10 KPa at a temperature of 25° C., each of the second sub-adhesive layer and the fourth sub-adhesive layer has a modulus in a range of 120 KPa±10 KPa at a temperature of −20° C., and each of the second sub-adhesive layer and the fourth sub-adhesive layer has a modulus in a range of 35 KPa±5 Kpa at a temperature of 60° C.

In some embodiments, the second sub-adhesive layer and the fourth sub-adhesive layer are flexible layers and made of different materials. The second sub-adhesive layer has a modulus in a range of 55 KPa±10 KPa at a temperature of 25° C., the second sub-adhesive layer has a modulus in a range of 120 KPa±10 KPa at a temperature of −20° C., and the second sub-adhesive layer has a modulus in a range of 35 KPa±5 KPa at a temperature of 60° C.

The fourth sub-adhesive layer has a modulus in a range of 30 KPa±5 KPa at a temperature of 25° C., the fourth sub-adhesive layer has a modulus in a range of 190 KPa±10 KPa at a temperature of −20° C., and the fourth sub-adhesive layer has a modulus in a range of 15 KPa±3 Kpa at a temperature of 60° C.

In some embodiments, the second sub-adhesive layer has the same thickness and same curing rate as a thickness and curing rate of the fourth sub-adhesive layer. The curing rate of each of the second sub-adhesive layer and the fourth sub-adhesive layer is in a range of 68%±3%, and each of the second sub-adhesive layer and the fourth sub-adhesive layer has a thickness in a range of 50 μm±5 μm.

In some embodiments, the polarizer is made of a flexible material and has a modulus in a range of 3.2 GPa±0.5 GPa.

In some embodiments, the polarizer has a thickness in a range of 45 μm±5 μm.

In some embodiments, the first sub-adhesive layer is made of a flexible material. The first sub-adhesive layer has a modulus in a range of 510 KPa±10 KPa under a temperature of 25° C., the first sub-adhesive layer has a modulus in a range of 0.29 MPa±0.01 MPa under a temperature of −20° C., and the first sub-adhesive layer has a modulus in a range of 370 KPa±10 KPa under a temperature of 60° C.

In some embodiments, the first sub-adhesive layer has a thickness in a range of 15 μm±5 μm.

In some embodiments, the third sub-adhesive layer is made of a flexible material. The third sub-adhesive layer has a modulus in a range of 45 KPa±10 KPa under the temperature of 25° C., the third sub-adhesive layer has a modulus in a range of 130 KPa±10 KPa under the temperature of −20° C., and the third sub-adhesive layer has a modulus in a range of 40 KPa±5 KPa under the temperature of 60° C.

In some embodiments, the third sub-adhesive layer has a thickness in a range of 15 μm±3 μm.

In some embodiments, the bottom film is made of a flexible material and has a modulus in a range of 3.2 GPa±0.5 GPa.

In some embodiments, the bottom film has a thickness in a range of 23 μm±3 μm.

In some embodiments, the cover plate is made of a flexible material and has a thickness in a range of 85 μm±5 μm.

In some embodiments, the support film comprises a plurality of sub-blocks uniformly distributed in an array and spaced apart from each other.

In some embodiments, the support film has a thickness in a range of 30 μm±10 μm.

In some embodiments, both of the second sub-adhesive layer and the fourth sub-adhesive layer are made of an optically transparent adhesive, and both of the first sub-adhesive layer and the third sub-adhesive layer are made of a pressure-sensitive adhesive.

In some embodiments, a distance from an end of the neck portion away from the body portion to an interface between the neck portion and the body portion is in a range of 7 mm to 12 mm.

In some embodiments, the arc line of the body portion has a length in a range of 38 cm±5 cm.

As a second aspect, an embodiment of the present disclosure provides a display device including the display module described above.

BRIEF DESCRIPTION OF THE DRAWINGS

The accompanying drawings, which facilitate a further understanding of the present disclosure and constitute a part of the specification, are used in conjunction with the following specific embodiments to explain the present disclosure, but are not intended to limit the present disclosure. The above and other features and advantages will become more apparent to those skilled in the art by describing exemplary embodiments thereof in detail with reference to the attached drawings, in which.

REFERENCE SIGNS LIST

Figure 1:
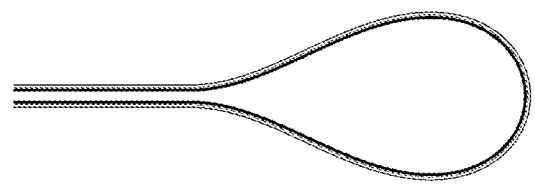
FIG. 1 is a schematic diagram showing a flexible module folded inward into a water-drop shape according to the existing art.

1. a flexible panel; 2. a first group of adhesive layers; 21. a first sub-adhesive layer; 22. a second sub-adhesive layer; 3. a first group of film layers; 31. a polarizer; 32. a cover plate; 4. a second group of adhesive layers; 41. a third sub-adhesive layer; 42. a fourth sub-adhesive layer; 5. a second group of film layers; 51. a bottom film; 52. a support film; 520. a sub-block; 6. a water-drop profile; 61. a neck portion; 62. a body portion; 7. a jig; 71. a first end; and 72. a second end.

DETAILED DESCRIPTION

In order to make those skilled in the art better understand the technical solutions of the present disclosure, the present disclosure is further described in detail below with reference to the accompanying drawings and specific embodiments.

The embodiments of the present disclosure will be described more fully hereinafter with reference to the accompanying drawings, but the embodiments shown can be embodied in different forms and should not be illustrated as being limited to the embodiments of the present disclosure. Rather, these embodiments are provided for the purpose of making the present disclosure thorough and complete, and will enable those skilled in the art to fully understand the scope of the present disclosure.

The embodiments of the present disclosure are not limited to the embodiments shown in the drawings, and include modifications of configurations formed based on the manufacturing process. Thus, the regions shown in the figures have schematic properties, and shapes of the regions shown in the figures show specific shapes of the regions, and the shapes of the regions are not limited thereto.

A flexible module capable of being folded inward may provide a storage space for flexible module when the flexible module is folded. In current research, the flexible module folded inward into a water-drop shape is an important development trend. FIG. 1 is a schematic diagram showing a flexible module folded inward into a water-drop shape.

In a stacked structure of the flexible module capable of being folded inward into a water-drop shape in the existing technology, defects exist in the differentiated design of the film layers in the stacked structure of the flexible module, thereby resulting in the poor matching performance of the film layers and the unreasonable design of the water-drop shape. In an inward folding test of the flexible module, the defects such as an adhesive failure of the adhesive layer and a failure of the display functional layers of the flexible module exist.

In order to reduce the risk of the defects such as the adhesive failure of the adhesive layer and the failure of the display functional layers of the flexible module, a design for matching the film layers of the flexible module and optimizing the water-drop shape of the display module is provided in the present disclosure. The embodiments of the present disclosure provide a display module and a display device.

Figure 2:
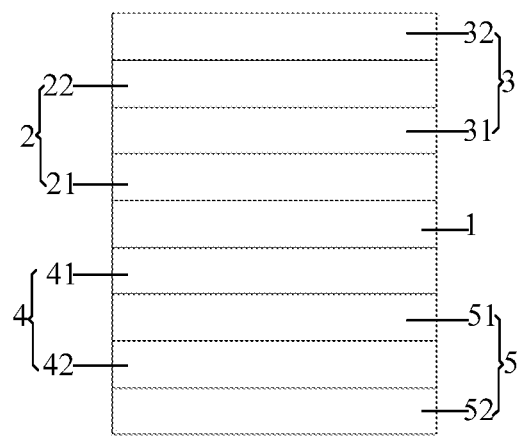
FIG. 2 is a cross-sectional view showing a structure of film layers of a display module according to an embodiment of the present disclosure.
Figure 3:
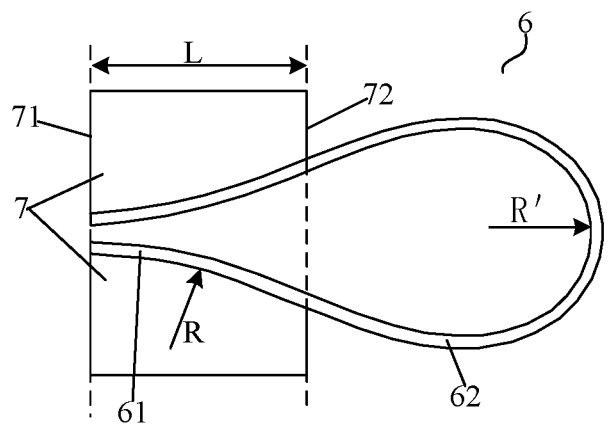
FIG. 3 is a schematic diagram showing an orthographic projection with a water-drop profile, on a first plane, of a curved plate formed by folding a display module according to an embodiment of the present disclosure.

An embodiment of the present disclosure provides a display module, as shown in FIG. 2 and FIG. 3. The display module includes a flexible panel 1, a first group of film layers 3 attached to a light-emitting side of the flexible panel 1 via a first group of adhesive layers 2, and a second group of film layers 5 attached to a non-light-emitting side of the flexible panel 1 distal to the light-emitting side via a second group of adhesive layers 4. The display module is capable of being folded into a curved plate. At least a portion of an orthographic projection of the display module on a first plane perpendicular to the curved plate has a shape of a water-drop profile 6. The water-drop profile 6 includes a neck portion 61 and a body portion 62. At least a portion of orthographic projections, on the first plane, of two opposite ends of the display module forms the neck portion 61, and an orthographic projection, on the first plane, of a middle portion of the display module between the two opposite ends forms the body portion 62. The neck portion 61 is an arc line and a curvature radius R at any point on the arc line is in a range from 16 mm to 20 mm. The body portion 62 is an arc line and a curvature radius R' at any point on the arc line is in a range of 4 mm±0.5 mm.

In some embodiments, the flexible panel 1 is an OLED (Organic Light-Emitting Diode) panel. A strain of the flexible panel 1 is in a safe range when the flexible panel 1 is folded, therefore the display performance of the flexible panel cannot be affected.

According to the present embodiment, by optimizing the matching performance of the film layers of the display module, the display side of the display module is folded inward to at least partially form a shape of water-drop profile 6, and the neck portion 61 and body portion 62 of the water-drop profile 6 meet the above parameter ranges of curvature radiuses, thereby optimizing the shape of the water-drop profile 6 of the folded display module, reducing a strain of the internal film layers of the display module when the display module is folded inward, reducing or avoiding the defects such as the adhesive failure of the adhesive layer and the failure of the display functional layers of the display module in the inward folding test, and as a result, the display module can pass a reliability test.

Figure 4:
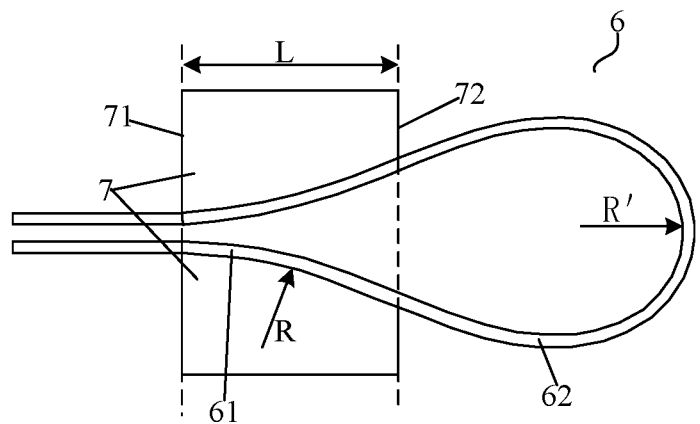
FIG. 4 is a schematic diagram showing an orthographic projection of a display module, two opposite ends of which are not bent and the remaining portion of which is bent into a water-drop profile, according to an embodiment of the present disclosure.
Figure 5:
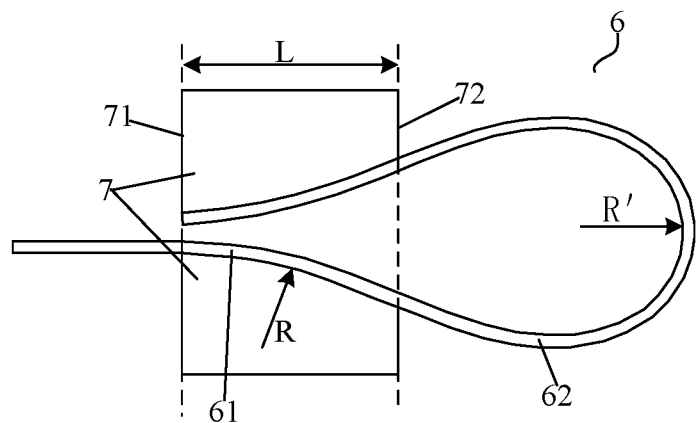
FIG. 5 is a schematic diagram showing an orthographic projection of a display module, one end of which is not bent and the remaining portion of which is bent into a water-drop profile, according to an embodiment of the present disclosure.

In the present embodiment, all of an orthographic projection of the display module on a first plane perpendicular to the curved plate is in a shape of a water-drop profile 6. It should be noted that, only a portion of the orthographic projection of the display module on the first plane perpendicular to the curved plate may be in a shape of a water-drop profile 6, and other portion of the display module is not bent and has a plane shape. The unbent portion with the plane shape of the display module may be opposite ends of the display module (as shown in FIG. 4), or alternatively may be one end of the display module (as shown in FIG. 5).

In some embodiments, the first group of film layers 3 includes a polarizer 31 and a cover plate 32. The first group of adhesive layers 2 includes a first sub-adhesive layer 21 and a second sub-adhesive layer 22. The first sub-adhesive layer 21, the polarizer 31, the second sub-adhesive layer 22, and the cover plate 32 are sequentially stacked on the light-emitting side of the flexible panel 1. The second group of film layers 5 includes a bottom film 51 and a support film 52. The second group of adhesive layers 4 includes a third sub-adhesive layer 41 and a fourth sub-adhesive layer 42. The third sub-adhesive layer 41, the bottom film 51, the fourth sub-adhesive layer 42, and the support film 52 are sequentially stacked on the non-light-emitting side of the flexible panel 1.

It should be noted that the first group of film layers 3 is not limited to the polarizer 31 and the cover plate 32, and other stacked film layers may also be provided; the first group of adhesive layers 2 is not limited to the first sub-adhesive layer 21 and the second sub-adhesive layer 22, and other stacked sub-adhesive layers may also be provided; the second group of film layers 5 is not limited to the bottom film 51 and the support film 52, and other stacked film layers may be also provided; the second group of adhesive layers 4 is not limited to the third sub-adhesive layers 41 and fourth sub-adhesive layers 42, and other stacked sub-adhesive layers may also be provided.

In some embodiments, the second sub-adhesive layer 22 and the fourth sub-adhesive layer 42 are made of an optically transparent adhesive; and the first sub-adhesive layer 21 and the third sub-adhesive layer 41 are made of a pressure-sensitive adhesive.

Figure 6:
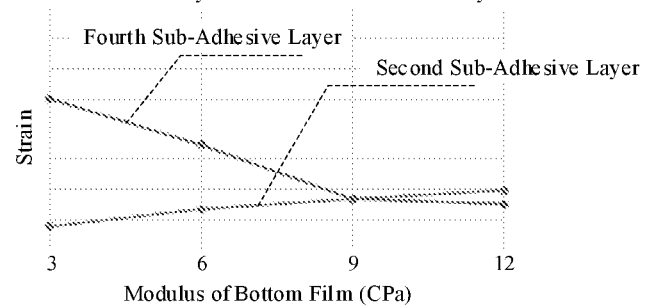
FIG. 6 is a schematic diagram showing an influence of a modulus of a bottom film on strains of a second sub-adhesive layer and a fourth sub-adhesive layer according to an embodiment of the present disclosure.
Figure 7:
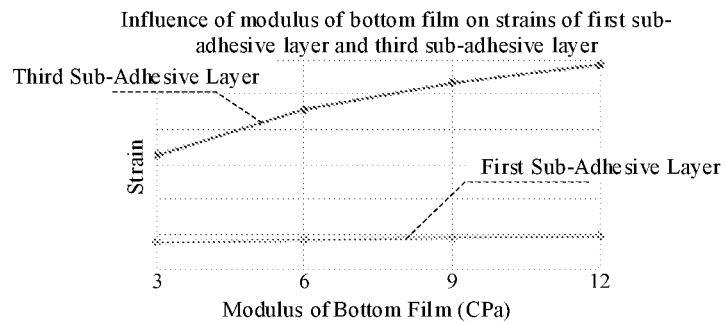
FIG. 7 is a schematic diagram showing an influence of a modulus of a bottom film on strains of a first sub-adhesive layer and a third sub-adhesive layer according to an embodiment of the present disclosure.

As shown in FIG. 6 and FIG. 7, the increased modulus of the bottom film 51 can reduce the strains of the fourth sub-adhesive layer 42 made of the optically transparent adhesive and the strains of the functional layers of the flexible panel 1, and increase the strains of the first sub-adhesive layer 21 and the third sub-adhesive layer 41 made of the pressure-sensitive adhesive. Therefore, it is necessary to match and design moduli and thicknesses of the film layers such as the bottom film 51, the second sub-adhesive layer 22, the fourth sub-adhesive layer 42, the first sub-adhesive layer 21, and the third sub-adhesive layer 41, so as to achieve the purpose of enabling the whole display module to pass the reliability test.

In some embodiments, the second sub-adhesive layer 22 and the fourth sub-adhesive layer 42 are flexible layers and made of the same material. A modulus of each of the second sub-adhesive layer 22 and the fourth sub-adhesive layer 42 ranges from 55 KPa±10 KPa under the temperature of 25° C., a modulus of each of the second sub-adhesive layer 22 and the fourth sub-adhesive layer 42 is in a range of 120 KPa±10 KPa under the temperature of −20° C., and a modulus of each of the second sub-adhesive layer 22 and the fourth sub-adhesive layer 42 is in a range of 35 KPa±5 KPa under the temperature of 60° C.

In some embodiments, the second sub-adhesive layers 22 and the fourth sub-adhesive layers 42 have the same thickness and the same curing rate as each other. A curing rate of each of the second sub-adhesive layers 22 and the fourth sub-adhesive layers 42 is in a range of 68%±3%, and each of the second sub-adhesive layer 22 and the fourth sub-adhesive layer 42 has a thickness in a range of 50 μm±5 μm.

In some embodiments, the polarizer 31 is made of a flexible material, and the polarizer 31 has a modulus in a range of 3.2 GPa±0.5 GPa.

In some embodiments, the polarizer 31 has a thickness in a range of 45 μm±5 μm.

In some embodiments, the first sub-adhesive layer 21 is made of a flexible material. The first sub-adhesive layer 21 has a modulus of 510 KPa±10 KPa under the temperature of 25° C., the first sub-adhesive layer 21 has a modulus of 0.29 MPa±0.01 MPa under the temperature of −20° C., and the first sub-adhesive layer 21 has a modulus of 370 KPa±10 KPa under the temperature of 60° C.

In some embodiments, the first sub-adhesive layer 21 has a thickness in a range of 15 μm±5 μm.

In some embodiments, the third sub-adhesive layer 41 is made of a flexible material. The third sub-adhesive layer 41 has a modulus in a range of 45 KPa±10 KPa under the temperature of 25° C., the third sub-adhesive layer 41 has a modulus in a range of 130 KPa±10 KPa under the temperature of −20° C., and the third sub-adhesive layer 41 has a modulus in a range of 40 KPa±5 KPa under the temperature of 60° C.

In some embodiments, the third sub-adhesive layer 41 has a thickness in a range of 15 μm±3 μm.

In some embodiments, the bottom film 51 is made of a flexible material, and the bottom film 51 has a modulus in a range of 3.2 GPa±0.5 GPa.

In some embodiments, the bottom film 51 has a thickness in a range of 23 μm±3 μm.

In some embodiments, the cover plate 32 is made of a flexible material and has a thickness a range of 85 μm±5 μm.

Figure 8:
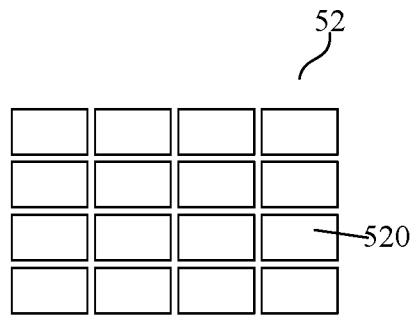
FIG. 8 is a schematic top view showing a structure of a support film according to an embodiment of the present disclosure.

In some embodiments, as shown in FIG. 8, the support film 52 includes a plurality of sub-blocks 520, and the plurality of sub-blocks 520 are uniformly distributed in an array and spaced apart from each other. The support film 52 may be made of a steel sheet. Since the support film 52 is formed of a plurality of sub-blocks 520 spaced apart from each other, on one hand the support film 52 can support the flexible panel 1 such that the flexible panel 1 is flattened on the support film very well; on the other hand a shape of the support film 52 changes along with the shape of the folded flexible panel 1 when the flexible panel is folded, therefore the strain of the support film 52 cannot affect the flexible panel 1.

In some embodiments, the support film 52 has a thickness in a range of 30 μm±10 μm.

By optimizing the moduli and thicknesses of the film layers of the display module, the strains of the internal film layers of the display module when the display module is folded inward can be reduced, the defects such as the adhesive failure of the adhesive layer and the failure of the display functional layers of the display module in the inward folding test can be reduced or avoided, and as a result, the display module can pass the reliability test. Meanwhile, the shape of the water-drop profile 6 of the display module formed after the display module is folded can be optimized.

In some embodiments, as shown in FIG. 3, a distance L from an end of the neck portion 61 away from the body portion 62 to an interface/a boundary line between the neck portion 61 and the body portion 62 is in a range from 7 mm to 12 mm. A jig 7 may help the display module to bend. When the display module is bent, the jig 7 is disposed at two opposite ends of the display module. One (hereinafter, a first end 71) of two opposite ends of the jig 7 is adhered to the two opposite ends of the display module, and the other one (hereinafter, a second end 72) of the two opposite ends of the jig 7 is adhered to a portion between the two opposite ends of the display module. The boundary line between the neck portion 61 and the body portion 62 refers to a boundary line of the display module corresponding to an edge of the second end 72 of the jig 7 adhered to the display module.

In some embodiments, the body portion 62 has an arc line with a length in a range of 38 cm±5 cm. The length of the arc line of the body portion 62 is determined according to the size of the display module.

An embodiment of the present disclosure further provides a display module which is different from the above embodiment in that the second sub-adhesive layer 22 and the fourth sub-adhesive layer 42 are flexible layers and made of different materials, as shown in FIG. 2. The second sub-adhesive layer 22 has a modulus in a range of 55 KPa±10 KPa under the temperature of 25° C., the second sub-adhesive layer 22 has a modulus in a range of 120 KPa±10 KPa under the temperature of −20° C., and the second sub-adhesive layer 22 has a modulus in a range of 35 KPa±5 KPa under the temperature of 60° C. The fourth sub-adhesive layer 42 has a modulus in a range of 30 KPa±5 KPa under the temperature of 25° C., the fourth sub-adhesive layer 42 has a modulus in a range of 190 KPa±10 KPa under the temperature of −20° C., and the fourth sub-adhesive layer 42 has a modulus in a range of 15 KPa±3 Kpa under the temperature of 60° C.

The structures and parameters of other film layers of the display module in the present embodiment are the same as those in the above embodiment, and are not described herein again.

Figure 9:
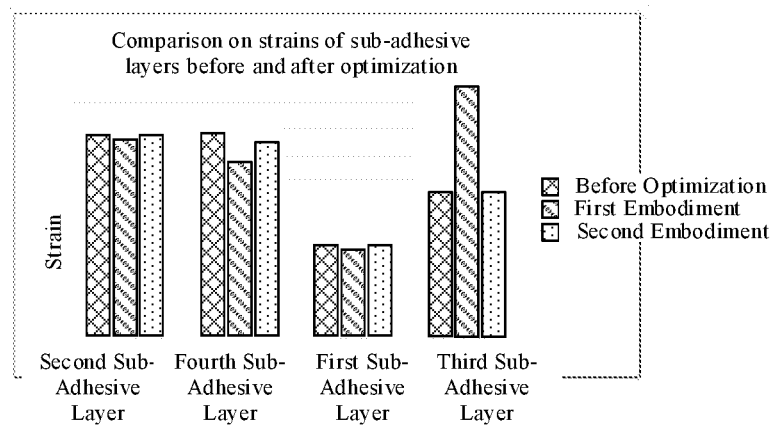
FIG. 9 is a schematic diagram showing a comparison on strains of adhesive layers of the display module according to the embodiment of the present disclosure and strains of adhesive layers before the optimization of the matching performance of the film layers.

The strains of the adhesive layers of the display module after the optimization of the matching performance of the film layers according to the two embodiments of the present disclosure is compared with the strains of the adhesive layers of the display module before the optimization of the matching performance of the film layers, as shown in FIG. 9. Since each of the strains of the second sub-adhesive layer 22 and the fourth sub-adhesive layer 42 according to the first embodiment of the present disclosure is small, the risk of the adhesive failure of the second sub-adhesive layer 22 and the fourth sub-adhesive layer 42 can be reduced. Meanwhile, the strains of the first sub-adhesive layer 21 according to the two embodiments of the present disclosure and the strain of the first sub-adhesive layer 21 before the optimization of the matching performance of the film layers remain stable. The strain of the third sub-adhesive layer 41 according to the second embodiment is equivalent to the strain of the third sub-adhesive layer 41 before the optimization of the matching performance of the film layers, and the strain of the third sub-adhesive layer 41 according to the first embodiment of the present disclosure is increased and still within a tolerance range of the strain of the adhesive material of the third sub-adhesive layer 41.

According to the display module provided by the embodiments of the present disclosure, by optimizing the moduli and the thicknesses of the film layers of the display module, the strains of the internal film layers of the display module when the display module is folded inward can be reduced, the defects such as the adhesive failure of the adhesive layer and the failure of the display functional layers of the display module in the inward folding test can be reduced or avoided, and as a result, the display module can pass the reliability test. Meanwhile, the shape of the water-drop profile 6 of the display module formed after the display module is folded can be optimized.

An embodiment of the present disclosure further provides a display device, which includes the display module according to any one of the embodiments described above.

By utilizing any one of the display modules in the embodiments of the present disclosure, the optimization of the moduli and the thicknesses of the film layers of the display device can be realized, the strains of the internal film layers of the display device when the display device is folded inward can be reduced, the defects such as the adhesive failure of the adhesive layer and the failure of the display functional layers of the display device in the inward folding test can be reduced or avoided, and as a result, the display device can pass the reliability test. Meanwhile, the shape of the water-drop profile 6 of the display device formed after the display device is folded can be optimized.

The display device according to the embodiments of the present disclosure may be any product or component with a display function, such as an OLED panel, an OLED television, a display, a mobile phone, a navigator, or the like.

It should be understood that the above implementations are merely exemplary embodiments for the purpose of illustrating the principles of the present disclosure, however, the present disclosure is not limited thereto. It will be apparent to those skilled in the art that various changes and modifications can be made without departing from the spirit and spirit of the present disclosure, which are also to be regarded as the scope of the present disclosure.

What is claimed is:

1. A display module, comprising: a flexible panel, a first group of film layers attached to a light-emitting side of the flexible panel via a first group of adhesive layers, and a second group of film layers attached, via a second group of adhesive layers, to a non-light-emitting side of the flexible panel away from the light-emitting side; wherein the display module is capable of being folded to a curved plate, such that at least a portion of an orthographic projection of the display module on a first plane perpendicular to the curved plate has a shape of a waterdrop profile comprising two neck portions and a body portion, where the two neck portions are formed on both sides of the body portion, the body portion is an arc line having a curvature radius in a range of 4±0.5 mm, the first group of film layers comprises a polarizer and a cover plate, the first group of adhesive layers comprises a first sub-adhesive layer and a second sub-adhesive layer, and the first sub-adhesive layer, the polarizer, the second sub-adhesive layer and the cover plate are sequentially stacked on the light-emitting side of the flexible panel, the second group of film layers comprises a bottom film and a support film, the second group of adhesive layers comprise a third sub-adhesive layer and a fourth sub-adhesive layer, and the third sub-adhesive layer, the bottom film, the fourth sub-adhesive layer, and the support film are sequentially stacked on the non-light-emitting side of the flexible panel, both of the second sub-adhesive layer and the fourth sub-adhesive layer are flexible layers and made of a same material, and each of the second sub-adhesive layer and the fourth sub-adhesive layer has a modulus in a range of 55 KPa±10 KPa at a temperature of 25° C., each of the second sub-adhesive layer and the fourth sub-adhesive layer has a modulus in a range of 120 KPa±10 KPa at a temperature of −20° C., and each of the second sub-adhesive layer and the fourth sub-adhesive layer has a modulus in a range of 35 KPa±5 Kpa at a temperature of 60° C.

2. The display module according to claim 1, wherein the second sub-adhesive layer has the same thickness and same curing rate as a thickness and curing rate of the fourth sub-adhesive layer, the curing rate of each of the second sub-adhesive layer and the fourth sub-adhesive layer is in a range of 68%±3%, and each of the second sub-adhesive layer and the fourth sub-adhesive layer has a thickness in a range of 50 μm±5 μm.

3. The display module according to claim 1, wherein the polarizer is made of a flexible material and has a modulus in a range of 3.2 GPa±0.5 GPa.

4. The display module according to claim 3, wherein the polarizer has a thickness in a range of 45 μm±5 μm.

5. The display module according to claim 1, wherein the first sub-adhesive layer is made of a flexible material, the first sub-adhesive layer has a modulus in a range of 510 KPa±10 KPa under a temperature of 25° C., the first sub-adhesive layer has a modulus in a range of 0.29 MPa±0.01 MPa under a temperature of −20° C., and the first sub-adhesive layer has a modulus in a range of 370 KPa±10 KPa under a temperature of 60° C.

6. The display module according to claim 5, wherein the first sub-adhesive layer has a thickness in a range of 15 μm±5 μm.

7. The display module according to claim 1, wherein the third sub-adhesive layer is made of a flexible material, the third sub-adhesive layer has a modulus in a range of 45 KPa±10 KPa under a temperature of 25° C., the third sub-adhesive layer has a modulus in a range of 130 KPa±10 KPa under a temperature of −20° C., and the third sub-adhesive layer has a modulus in a range of 40 KPa±5 KPa under a temperature of 60° C.

8. The display module according to claim 7, wherein the third sub-adhesive layer has a thickness in a range of 15 μm±3 μm.

9. The display module according to claim 1, wherein the bottom film is made of a flexible material and has a modulus in a range of 3.2 GPa±0.5 GPa.

10. The display module according to claim 9, wherein the bottom film has a thickness in a range of 23 μm±3 μm.

11. The display module according to claim 1, wherein the cover plate is made of a flexible material and has a thickness in a range of 85 μm±5 μm.

12. The display module according to claim 1, wherein the support film comprises a plurality of sub-blocks uniformly distributed in an array and spaced apart from each other.

13. The display module according to claim 12, wherein the support film has a thickness in a range of 30 μm±10 μm.

14. The display module according to claim 1, wherein both of the second sub-adhesive layer and the fourth sub-adhesive layer are made of an optically transparent adhesive, and both of the first sub-adhesive layer and the third sub-adhesive layer are made of a pressure-sensitive adhesive.

15. The display module according to claim 1, wherein a distance from an end of the neck portions away from the body portion to an interface between the neck portions and the body portion is in a range of 7 mm to 12 mm.

16. The display module according to claim 1, wherein the arc line of the body portion has a length in a range of 38 cm±5 cm.

17. The display module according to claim 1, wherein one of the two neck portions is a convex curve having a curvature radius in a range from 16 mm to 20 mm and directly connected to a concave arc segment of the body portion, and the other of the two neck portions is a convex curve having a curvature radius in a range from 16 mm to 20 mm and directly connected to the concave arc segment of the body portion.

18. A display device, comprising the display module according to claim 1.

* * * * *